(12) United States Patent
Goh et al.

(10) Patent No.: US 7,102,177 B2
(45) Date of Patent: Sep. 5, 2006

(54) LIGHT-EMITTING DIODE INCORPORATING GRADIENT INDEX ELEMENT

(75) Inventors: Kee Siang Goh, Penang (MY); Yee Loong Chin, Parak (MY); Boon Kheng Lee, Simpang Empat (MY); Cheng Why Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 59 days.

(21) Appl. No.: 10/649,094

(22) Filed: Aug. 26, 2003

(65) Prior Publication Data
US 2005/0045896 A1 Mar. 3, 2005

(51) Int. Cl.
*H01L 33/00* (2006.01)

(52) U.S. Cl. ............ 257/98; 257/99; 359/652; 359/653; 359/654

(58) Field of Classification Search ............ 257/98, 257/99; 385/33, 92, 34, 124; 359/652, 653, 359/654
See application file for complete search history.

(56) References Cited

U.S. PATENT DOCUMENTS

| | | | | |
|---|---|---|---|---|
| 4,865,029 A | * | 9/1989 | Pankratov et al. ............ 606/4 |
| 5,814,524 A | * | 9/1998 | Walt et al. ............ 436/518 |
| 5,815,318 A | * | 9/1998 | Dempewolf et al. ........ 359/653 |
| 6,263,133 B1 | * | 7/2001 | Hamm ............ 385/33 |
| 6,571,482 B1 | * | 6/2003 | Tymianski ............ 33/265 |
| 6,945,672 B1 | * | 9/2005 | Du et al. ............ 362/241 |
| 2002/0122638 A1 | * | 9/2002 | Wang et al. ............ 385/92 |
| 2003/0081897 A1 | * | 5/2003 | Itoh et al. ............ 385/34 |

* cited by examiner

*Primary Examiner*—Minhloan Tran
*Assistant Examiner*—Tan Tran

(57) ABSTRACT

The light-emitting device includes a light source and a gradient index (GRIN) element. The GRIN element has a cylindrical refractive index profile in which the refractive index varies radially and is substantially constant axially. The GRIN element includes a first end surface opposite a second end surface and is characterized by a length-to-pitch ratio. The GRIN element is arranged with the first end surface adjacent the light source to receive light from the light source, and emits the light from the second end surface in a radiation pattern dependent on the length-to-pitch ratio. Since the radiation pattern depends on the length-to-pitch ratio of the GRIN element, LEDs with different radiation patterns can be made simply by using GRIN elements of appropriate lengths.

12 Claims, 7 Drawing Sheets

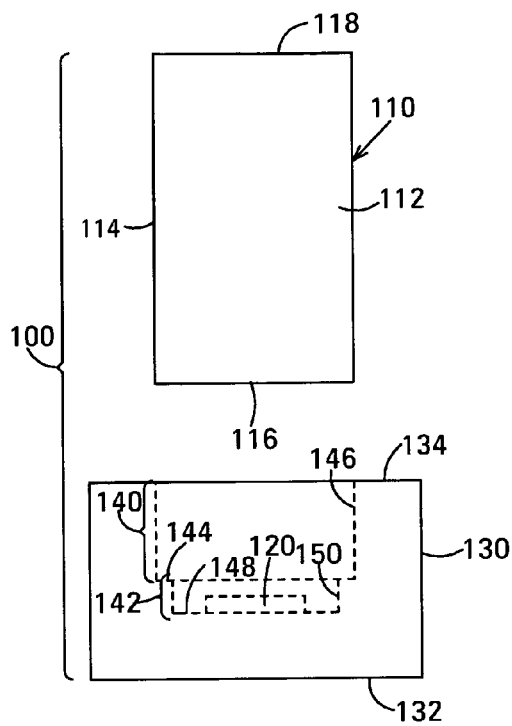
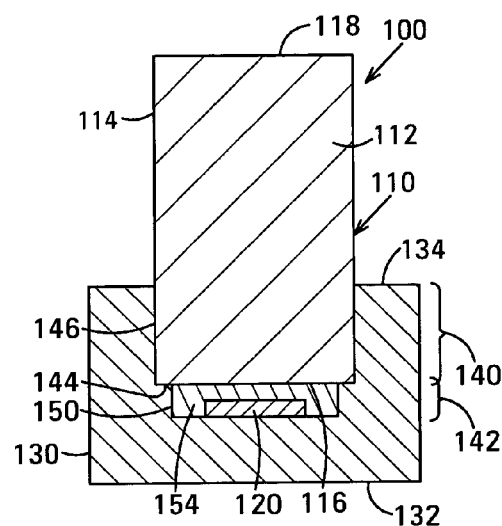
FIG.4A   FIG.4C
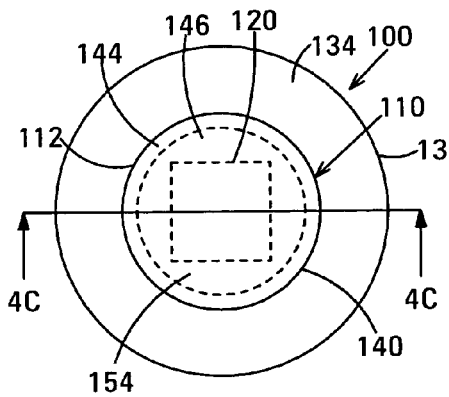
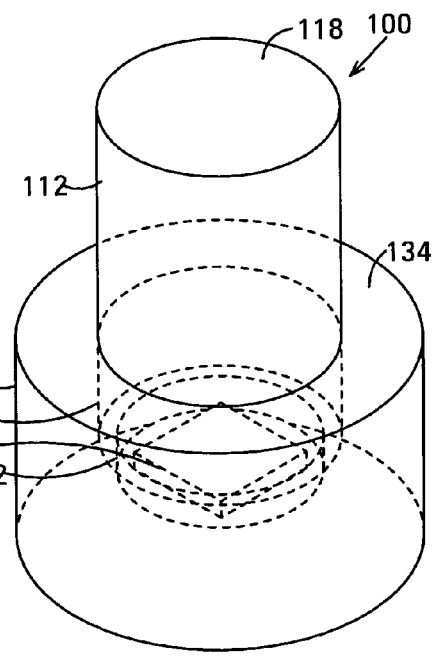
FIG.4B   FIG.4D

LIGHT-EMITTING DIODE INCORPORATING GRADIENT INDEX ELEMENT

BACKGROUND OF THE INVENTION

Light-emitting diodes (LEDs) have a wide range of applications in industry. An LED is typically composed of a semiconductor die mounted on a header that provides mechanical support for and electrical connections to the semiconductor die. The semiconductor die is then encapsulated to protect it. The encapsulation is transparent or includes a transparent window to allow light generated by the semiconductor die to be emitted. The header and the encapsulation collectively constitute the package of the LED.

Parameters used to characterize the performance of an LED include brightness and radiant power. Another important parameter used to characterize the performance of an LED is the radiation pattern, i.e., the dependence of brightness on angle relative to the optical axis of the LED. The semiconductor die emits light in a substantially isotropic radiation pattern, which is suitable for relatively few applications. Typical LEDs include a converging element that includes a convex surface to generate a specific radiation pattern from the isotropic radiation pattern of the semiconductor die. Examples of such converging elements include a convex spherical or aspherical lens and encapsulation that includes a convex surface facing the semiconductor die.

Different applications use LEDs with different radiation patterns. For example, an LED configured for use in back lighting for an LCD screen has a relatively wide and uniformly-spread radiation pattern, whereas an LED configured for use in a signal light, such as a traffic light, has a relatively narrow radiation pattern and a high intensity. An LED configured for use in a position or rotation encoder has a collimated or point source radiation pattern.

The need to provide LEDs configured for many different applications that require different radiation patterns cause manufacturers of LEDs to use a large number of different types of LED package, each with its own shape. The need to keep an inventory of many types of package to meet customers' demands contributes to the manufacturing cost of LEDs. Since manufacturers are under constant pressure to reduce costs, what is needed is an LED that can easily be manufactured with a range of different radiation patterns without the need to keep an inventory of many different types of package. What is also needed is a way to manufacture such LEDs.

SUMMARY OF THE INVENTION

In a first aspect, the invention provides a light-emitting device that includes a light source and a gradient index (GRIN) element. The GRIN element has a cylindrical refractive index profile in which the refractive index varies radially and is substantially constant axially. The GRIN element includes a first end surface opposite a second end surface and is characterized by a length-to-pitch ratio. The GRIN element is arranged with the first end surface adjacent the light source to receive light from the light source. The GRIN element emits the light from the second end surface in a radiation pattern dependent on the length-to-pitch ratio.

In a second aspect, the invention provides a method of making a light-emitting device. In the method, a light source and a GRIN element are provided. The GRIN element has a cylindrical refractive index profile in which the refractive index varies radially and is substantially constant axially. The GRIN element includes a first end surface opposite a second end surface and is characterized by a length-to-pitch ratio. Additionally in the method, the GRIN element is arranged with the first end surface thereof adjacent the light source to receive light from the light source. The GRIN element emits the light from the second end surface in a radiation pattern that depends on the length-to-pitch ratio.

Since the radiation pattern depends on the length-to-pitch ratio of the GRIN element, LEDs with different radiation patterns can be made simply by using GRIN elements of appropriate lengths.

BRIEF DESCRIPTION OF THE DRAWINGS

FIGS. 4A–4D are respectively a side view, a top view, a cross-sectional view and an isometric view of another embodiment of an LED in accordance with the invention. The cross-sectional view of FIG. 4C is taken along the section line 4C—4C in FIG. 4B.

DETAILED DESCRIPTION OF THE INVENTION

Light is refracted when it passes through an interface between materials of different refractive index. The refraction follows the well-known Snell's law. Many conventional optical systems incorporate lenses and other elements with at least one curved surface through which light is passed to perform a desired function such as focusing or collimating.

Such refracting elements and the media in which they are located typically have a homogeneous refractive index.

Gradient index (GRIN) material has become affordable in the past decade. Such material has a non-homogeneous refractive index. Optical devices with many of the optical properties of a conventional lens can be made using GRIN material having flat surfaces instead of the curved surfaces of a conventional lens. One type of GRIN material has a cylindrical refractive index profile in which the refractive index varies radially and in which the refractive index at a given radius is substantially constant axially. The refractive index varies radially in the sense that it decreases with increasing distance from the axis of radial symmetry of the cylindrical refractive index profile. A GRIN element having a cylindrical refractive index profile is typically cylindrical in shape, but is not necessarily cylindrical in shape.

Figure 1A:
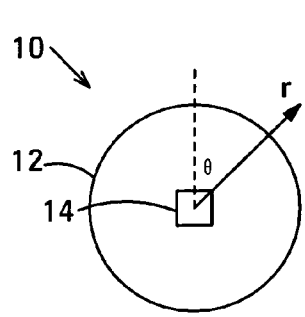
FIGS. 1A and 1B are an end view and a side view, respectively, of an embodiment of a light-emitting device (LED) in accordance with the invention.
Figure 1B:
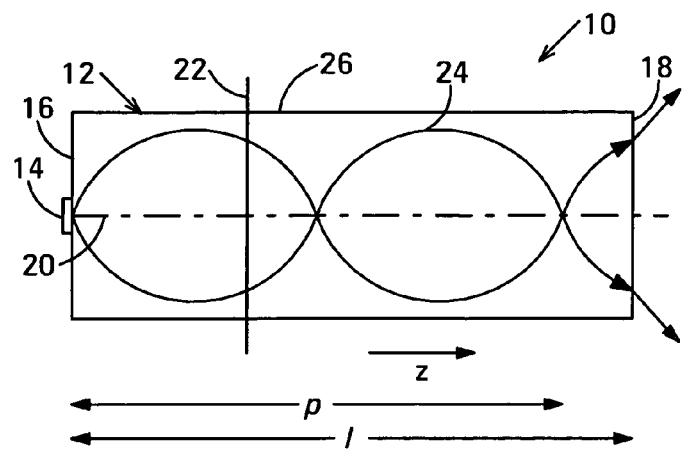

FIGS. 1A and 1B are an end view and a side view, respectively, of a first embodiment 10 of a light-emitting device (LED) in accordance with the invention. LED 10 is composed of a GRIN element 12 and a light-emitting semiconductor die 14 located adjacent an end surface 16 of the GRIN element. Light generated by semiconductor die 14 passes axially through GRIN element 12 and is emitted from end surface 18, opposite end surface 16. Both end surfaces 16 and 18 are substantially plane surfaces.

GRIN element 12 has a cylindrical refractive index profile. In the example shown, GRIN element 12 is also cylindrical in shape, but other shapes are possible.

Figure 2A:
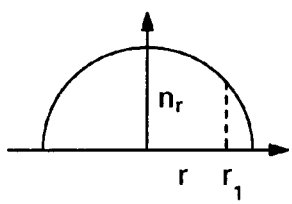
FIGS. 2A and 2B are graphs showing an example of how the cylindrical refractive index profile of a GRIN element respectively varies radially and axially.
Figure 2B:
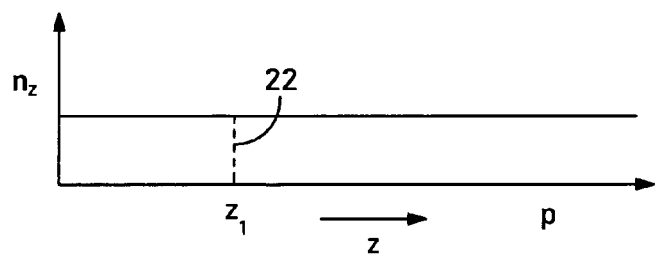
Figure 2C:
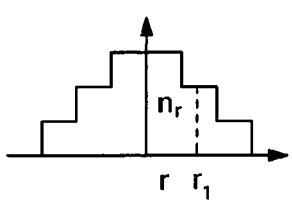
FIG. 2C is a graph showing an example of an alternative radial variation.

FIGS. 2A and 2B show an example of how the cylindrical refractive index profile of GRIN element 12 respectively varies radially and axially. FIG. 2C shows an example of an alternative radial variation. FIGS. 2A and 2C show examples of how the cylindrical refractive index profiles varies radially in a plane 22 orthogonal to the axis of radial symmetry 20 of the cylindrical refractive index profile. Plane 22 is located in GRIN element 12 at an arbitrary distance $z_1$ from end surface 16. The origins in FIGS. 2A and 2C correspond to axis 20. FIG. 2B shows an example of how the cylindrical refractive index profile of GRIN element 12 varies axially at a radius $r_1$ from the axis of radial symmetry of the cylindrical refractive index profile. The origin in FIG. 2B corresponds to end surface 16. FIG. 2A shows an example in which the refractive index decreases smoothly with increasing radius from axis 20. FIG. 2C shows an example in which the refractive index decreases in steps with increasing radius from axis 20.

FIG. 2A shows that, in plane 22, the refractive index $n_r$ at radius r progressively decreases with increasing radius from axis 20. FIG. 2C shows that, in plane 22, the refractive index $n_r$ at radius r decreases in steps with increasing radius from axis 20. The variation of refractive index with radius in a plane orthogonal to axis 20 would be similar at any point along axis 20 to that shown in FIG. 2A or FIG. 2C. Moreover, the refractive index at radius $r_1$ would nominally be the same regardless of the angle θ between an arbitrary reference direction and the direction in which the radius r is measured.

FIG. 2B shows that the refractive index $n_z$ at distance z and radius $r_1$ remains constant regardless of the distance z from end surface 16. The refractive index at distance z also remains nominally constant regardless of distance at any other radius and at any value of the angle θ between the direction in which the radius r is measured and an arbitrary reference direction. In practical GRIN elements, small variations in the nominal refractive index with distance z occur.

In an exemplary embodiment, the variation of refractive index $n_r$ with radius r of the cylindrical refractive index profile is described by equation (1):

$$n_r = n_0(1-(Ar^2)/2) \qquad (1)$$

where $n_r$ is the refractive index at radius r, $n_0$ is the refractive index at the center of the cylindrical refractive index profile, i.e., at r=0, and A is a material-dependent gradient constant. In this example, the variation of refractive index with radius has a quadratic function, with the steepness of the change of refractive index being determined by the value of the gradient constant A.

FIG. 1B shows the path 24 of light emitted by semiconductor die 14 in a direction non-parallel to axis of radial symmetry 20. Path 24 bends as the light travels from end surface 16 towards end surface 18. The path bends initially due to the light encountering a progressively decreasing refractive index. As a result of the bending of path 24, the angle between the path and axis 20 progressively decreases with increasing distance from end surface 16. At a certain distance from end surface 16, path 24 is parallel to axis 20. At distances greater than this certain distance, path 24 bends towards axis 20 as the light encounters a progressively increasing refractive index. Eventually, path 24 re-crosses axis 20 as shown. After re-crossing the axis, path 24 bends towards the axis, becomes parallel to the axis and bends away from the axis until it re-crosses the axis a second time. The second re-crossing of the axis is in the same direction as the initial direction of path 24 adjacent end surface 16. The path shape just described repeats along the length l of GRIN element 12 until the light reaches end surface 18. The light is then emitted from end surface 18.

The bending of the path 24 of the light emitted by semiconductor die 14 prevents the light from escaping from the curved surface 26 of GRIN element 12. Instead, most of the light emitted by semiconductor die 14 is directed towards end surface 18, from which it is emitted. As the light travels further in the z-direction from end surface 16, GRIN element 12 repetitively re-focuses light at respective focal points offset in the z-direction from end surface 16.

GRIN element 12 is characterized by a parameter called pitch, which is the distance light travels in the z-direction to path 24 undergo one full sinusoidal cycle in which the light diverges from source, converges on a first focal point, diverges from the first focal point and converges on a second focal point. The path of the light passes through the second focal point in the same direction as initial direction of the path adjacent end surface 16. The pitch of the GRIN element depends on the above-mentioned gradient constant A. The relationship between the length of the GRIN element, the gradient constant A and the pitch p is given by equation (2):

$$p = (\sqrt{A}/2\pi)z \qquad (2)$$

End surface 18 is a plane surface. Light travelling through GRIN element 12 and incident on end surface 18 at a non-zero angle of incidence is refracted at end surface 18. In air, the angle of refraction is greater than the angle of incidence in accordance with Snell's law. It can be seen from FIG. 1B that the angle of incidence of light on end surface 18 depends on the distance of end surface 18 from end surface 16, i.e., on the physical length of GRIN element 12. Accordingly, the radiation pattern of the light emitted from end surface 18 depends on the radiation pattern of the light incident on end surface 18. The radiation pattern of the light incident on end surface 18 depends on the distance of end surface 18 from end surface 16. Therefore, the radiation pattern of the light emitted from end surface 18 of LED 10 will depend on the length-to-pitch ratio of GRIN element 12.

Thus, the invention provides LEDs with configurable radiation patterns. The radiation pattern of each LED is defined simply by appropriately selecting the length-to-pitch ratio of the GRIN element 12. The LED manufacturer no longer has to keep a large inventory of dome lenses or dome lens molds to be able to manufacture LEDs with different radiation patterns. Moreover, the invention allows the radiation pattern of an existing GRIN element-based LED to be changed simply by changing the physical length of the GRIN element.

FIGS. 3A–3D schematically show the radiation patterns of four exemplary embodiments of LED 10 with different length-to-pitch ratios. The radiation patterns are characterized by an angle α, which is the angle between the axis of symmetry of the cylindrical refractive index profile of the GRIN element and the direction at which the intensity of the light emitted by the LED falls to one-half of maximum.

Figure 3A:
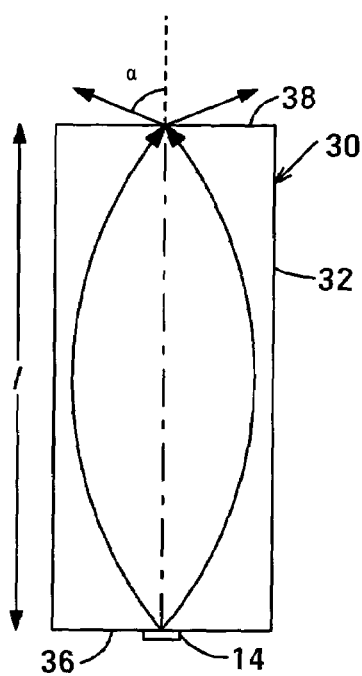
FIGS. 3A–3D schematically show the radiation patterns of four exemplary embodiments of an LED in accordance with the invention with different length-to-pitch ratios.

In exemplary embodiment 30 shown in FIG. 3A, GRIN element 32 has a physical length equal to one half of the pitch, i.e., l=p/2, and a length-to-pitch ratio of 0.5. GRIN element 32 focuses the light emitted by semiconductor die 14 located adjacent end surface 36 on end surface 38. Accordingly, LED 30 emits the light from a point source. Practical embodiments of LED 30 do not emit the light from an ideal point source because the light-emitting area of semiconductor die 14 is not infinitesimally small. The term from a point source as used in this disclosure will be taken to encompass such a non-ideal point source.

Figure 3B:
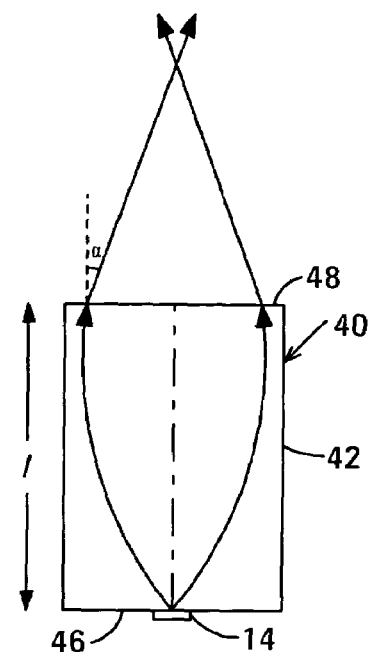

In embodiment 40 shown in FIG. 3B, GRIN element 42 has a physical length intermediate between one quarter and one half of the pitch, i.e., p/4<l<p/2, and a length-to-pitch ratio between 0.25 and 0.5. The light emitted by semiconductor die 14 located adjacent end surface 46 is converging when it reaches end surface 48 after passing through GRIN element 42. After refraction by passing through end surface 48, the light emitted by LED 40 has a converging radiation pattern characterized by the angle α.

Figure 3C:
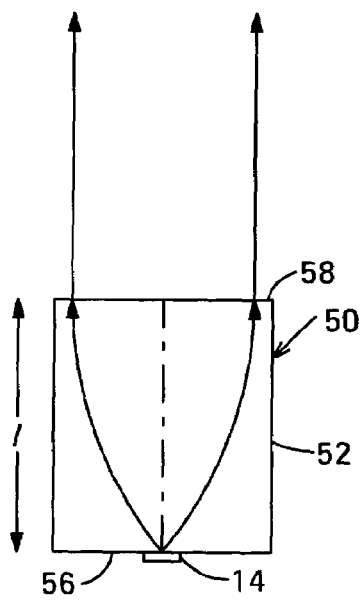

In embodiment 50 shown in FIG. 3C, GRIN element 52 has a physical length equal to one quarter of the pitch, i.e., l=p/4, length-to-pitch ratio of 0.25. The light emitted by semiconductor die 14 located adjacent end surface 56 is traveling orthogonal to end surface 58 when reaches end surface 58 after passing through GRIN element 52. After passing through end surface 58, the light is emitted by LED 50 in a parallel radiation pattern characterized by angle α of zero. The light emitted by embodiment 50 is a collimated beam.

Figure 3D:
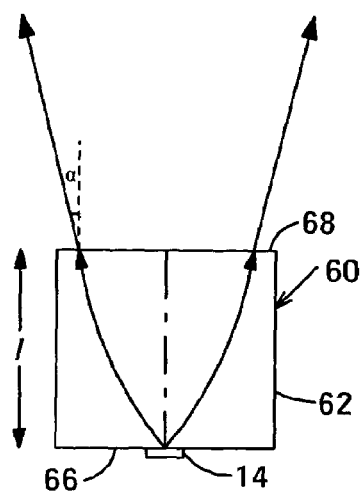

In embodiment 60 shown in FIG. 3D, GRIN element 62 has a physical length less than one quarter of the pitch, i.e., l<p/4, and a length-to-pitch ratio of less than 0.25. The light emitted by semiconductor die 14 located adjacent end surface 66 is diverging when it reaches end surface 68 after passing through GRIN element 62. After refraction by passing through end surface 68, the light emitted by LED 60 has a diverging radiation pattern characterized by the angle α.

FIGS. 4A–4D are respectively a side view, a top view, a cross-sectional view and an isometric view of another embodiment 100 of an LED in accordance with the invention. LED 100 is composed of a GRIN element 110, a semiconductor die 120 and a cup-type header 130.

Header 130 has a device mounting surface 132 and a surface 134 opposite the device mounting surface. LED 100 is mounted on a printed circuit board or other substrate (not shown) with device mounting surface 132 facing the printed circuit board. Device mounting surface 132 carries conductive elements (not shown to simplify the drawing) electrically connected to semiconductor die 120.

Header 130 defines two concatenated cavities 140 and 142 that extend, in order, into the header from header surface 134. Cavity 140 is cylindrical in shape. Cavity 140 is a partially closed cavity and has an annular, flat end surface 144 remote from header surface 134 and a curved side surface 146. Cavity 142 is cylindrical in shape with a smaller diameter than cavity 140, but can have other shapes. Cavity 142 is a closed cavity and has a flat die mounting surface 148 remote from header surface 134. Cavity 142 also has a curved side surface 150.

Cavity 142 accommodates semiconductor die 120 mounted on the die mounting surface 148. Cavity 142 additionally accommodates an electrical connection, typically a wire bond, that extends between the exposed surface of the die and an electrical conductor that extends through header 130 to mounting surface 132. Neither the electrical connection nor the electrical conductor is shown to simplify the drawing.

Cavity 142 additionally accommodates index matching material 154 having a refractive index greater than that of air and preferably intermediate between those of semiconductor die 120 (typically greater than 3) and GRIN element 110 (typically about 1.5). Suitable index matching materials include optical gels and optical liquids sold by Cargille Laboratories of Cedar Grove, N.J. Another suitable material is an optical adhesive composed of Ablebond® epoxy resin or HXTAL NYL-1 epoxy resin and a mixture of 1,2-epoxy-3-[2,4,6-tribromophenoxy] propane and 1,2-epoxy-3-[2,4,6-triiodophenoxy] propane. This adhesive is described in 28–2 J. AM. INST. CONSERVATION. 127–136 (1989).

GRIN element 110 has a body 112 and exhibits the cylindrical refractive index profile described above. Body 112 is cylindrical in shape. The axes of symmetry of the refractive index profile and the body coincide. Body 112 has a curved side surface 114 and opposed end surfaces 116 and 118. End surface 116 is flat. In the example shown, end surface 118 is also flat. Both end surfaces are orthogonal to the axes of symmetry of body 112 and its cylindrical refractive index profile. In other embodiments, at least end surface 118 is curved, e.g., convex, but, in accordance with the invention, LEDs having different radiation patterns can all be made each with a body 112 of a different length and an end surface 118 of the same shape.

The length of body 112 depends on the pitch of the cylindrical refractive index profile of body 112 and the desired radiation pattern. As noted above, LEDs having many different radiation patterns can all be structurally identical apart from the length-to-pitch ratio of their GRIN elements 110.

The diameter of cylindrical cavity 140 defined in header 130 is comparable with the diameter of body 112. In one embodiment, the diameter of cavity 140 is slightly less than that of body 112, which makes GRIN element 110 a push fit into cavity 140. A diameter difference in the range of 30–40 μm is sufficient to allow the GRIN element to be pushed into cavity 140 during assembly yet allows the header to retain GRIN element in place throughout the operational life and environmental range of LED 100. The mutual deformation of header 130 and GRIN element 110 resulting from the push fit forms a hermetic seal between the GRIN element and the header. Thus, GRIN element 110 and header 130 collectively encapsulate semiconductor die 120, and no additional element is needed for this purpose. End surface 144 of cavity 140 defines the extent to which GRIN element fits into the header.

In other embodiments, the diameter of cavity 140 is greater than that of body 112 and GRIN element 110 is a loose fit in cavity 140. In such embodiments, the GRIN element is retained in the cavity 140 of header 130 by a film of a suitable adhesive that fills the gap between the side surface 146 of cavity 140 and the curved surface 114 of body 112. GRIN element 110, header 130 and the adhesive collectively encapsulate semiconductor die 120. Other ways of retaining GRIN element 110 in header 130 and of encapsulating semiconductor die 120 may be used.

GRIN element 110 is inserted into cavity 140 until end surface 116 of body 112 abuts the end surface 144 of cavity 140. The juxtaposition of end surfaces 116 and 144 defines the spatial relationship between the light-emitting surface of semiconductor die 120 and end surface 116 of GRIN element 110. This relationship is defined regardless of the way in which GRIN element 110 is retained in header 130.

LED 100 is made by mounting semiconductor die 120 on die mounting surface 148 of cavity 142 in header 130. An electrical connection (not shown) is between an electrode (not shown) typically located on the light-emitting surface of the semiconductor die and a conductor (not shown) that extends through the header to a conductive element (not shown) on device mounting surface 134. Processes for mounting semiconductor die on headers and for making electrical connections between semiconductor die and headers are known in the art and will therefore not be described here. Preliminary electrical and electro-optical testing may be carried out at this stage.

A measured quantity of index matching material 154 is introduced into cavity 142, specifically onto the light-emitting surface of semiconductor die 120. In one embodiment, part of the index-matching material projects into cavity 140 to ensure that the index material will contact the end surface 116 of GRIN element 110 when the latter is inserted into cavity 140.

GRIN element 110 and header 130 are then assembled as described above. LED 100 is then ready for final electrical and electro-optical testing.

In a process in which LEDs 100 are mass manufactured, hundreds of header-die assemblies, i.e., semiconductor die 120 mounted in header 130, are loaded into a first jig and a corresponding number of GRIN elements 110 are loaded into a second jig having the same pitch as the first jig. The jigs are placed in a suitable press with the GRIN elements facing the cavities 140 in the headers 130. The press is then used to press all the GRIN elements into the cavities 140 in the respective headers.

GRIN material is available in the form of cylindrical rods having a length many times that of the individual GRIN elements. The GRIN material is typically composed of a rod of a host material such as silica ($SiO_2$) doped with an index-changing dopant. The dopant is deposited on the curved surface of the rod of host material. The rod with the dopant on its curved surface is then heated and the dopant diffuses radially towards the center of the rod. Dopants such as boron or fluorine reduce the refractive index of the host material to produce a cylindrical refractive index profile similar to that shown in FIGS. 2A and 2B in which the refractive index decreases with increasing radius.

Another embodiment is made from materials composed of nanoparticles of one or more transparent high refractive index metal oxides such as titanium dioxide ($TiO_2$), magnesium oxide (MgO), zirconium oxide ($ZrO_2$) and aluminum oxide ($Al_2O_3$) embedded in a carrier of a low refractive index material such as epoxy. The density of the nanoparticles determines the refractive index of the material. A rod of a high refractive index form of the material, or another high refractive index material, is successively coated with layers of progressively lower refractive index forms of the material to form a rod of GRIN material having a cylindrical refractive index profile in which the refractive index decreases step-wise with increasing radius, as shown in FIG. 2C.

In another embodiment, a filament of an index-increasing dopant material is coated with a transparent host material. The resulting assembly is heated, which causes the index-increasing dopant material to diffuse radially outwards and produce in the host material a cylindrical refractive index profile in which the refractive index decreases progressively with increasing radius. This process establishes a cylindrical refractive index profile in the host material regardless of the cross-sectional shape of the host material. Thus, the host material need not be cylindrical in shape. The techniques exemplified above and other techniques for making rods of GRIN material are known in the art and will therefore not be described in more detail here.

Multiple GRIN elements similar to GRIN element 110 are made by dividing a cylindrical rod of GRIN material into multiple cylindrical pieces each of a length that, in relation to the pitch of the GRIN material, gives a length-to-pitch ratio corresponding to the desired radiation pattern. The pieces into which a rod of GRIN material is divided are typically all of the same length. When LEDs having a variety of radiation patterns are being produced, the cylindrical pieces into which a rod of GRIN material is divided can have a number of different lengths corresponding to the mix of radiation patterns. The mix of lengths into which a rod of GRIN material is divided can be determined using a yield maximization process to reduce wastage.

The rod of GRIN material is divided into cylindrical pieces by processes such as cleaving, cutting and sawing. Techniques, such as hot cutting and laser cutting, used for cutting optical fibers are also applicable to divide the rod of GRIN material into GRIN elements 110. Some dividing process produce cylindrical pieces that are immediately ready for installation in respective headers as GRIN elements. Such cylindrical pieces are produced with a length equal to the length that gives the length-to-pitch ratio corresponding to the desired radiation pattern.

The cylindrical pieces produced by other dividing processes have rough end surfaces that require polishing to produce a respective GRIN element. Cylindrical pieces subject to polishing initially have a length slightly longer than the length that gives the length-to-pitch ratio corresponding to the desired radiation pattern. The end surfaces of such cylindrical pieces are polished using chemical-mechanical polishing (CMP), for example, or another suitable process to form respective GRIN elements. Polishing reduces the length of the cylindrical pieces to the length corresponding to the desired radiation pattern. The purpose of polishing after dividing the rod of GRIN material is to make sure the end surfaces are flat and are free of undesired material that would degrade the optical performance. High-performance polishing is generally not needed. The resulting GRIN elements are then ready for installation in respective headers.

In applications in which LEDs with accurately defined radiation patterns are needed, the pitch of each rod of GRIN material is measured and the lengths that, together with the measured pitch, give the length-to-pitch ratio corresponding to the desired radiation patterns are calculated. The rod is then divided into cylindrical pieces having the calculated lengths.

The simplicity of GRIN element 110 makes the process for manufacturing GRIN elements very flexible so that changes in the mix of radiation patterns demanded by the market can be responded to without the need to carry a large inventory of different parts. Moreover, excess inventory of, for example, finished point source LEDs (FIG. 3A) can be converted into LEDs having another radiation pattern for which there is market demand by dividing the GRIN elements of the LEDs lengthways to reduce their length to provide a length-to-pitch ratio corresponding to the needed radiation pattern.

Figure 5A:
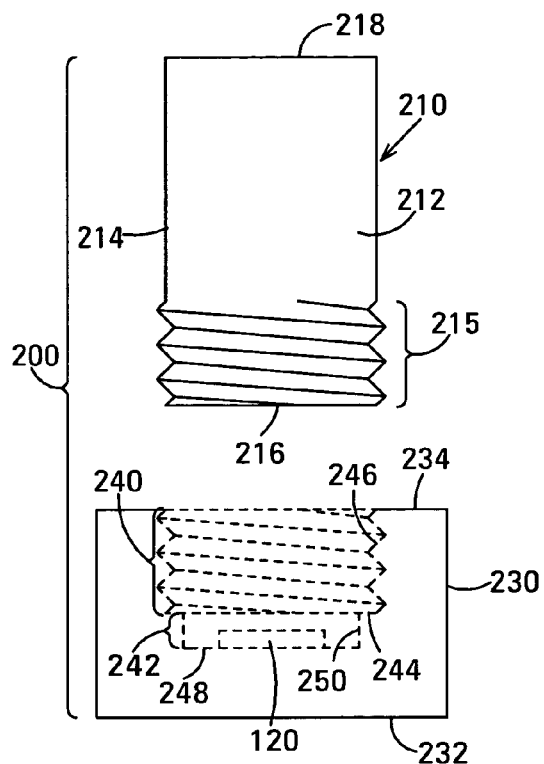
FIGS. 5A–5C are respectively an exploded side view, a top view and a cross-sectional view of another embodiment of an LED in accordance with the invention. The cross-sectional view of FIG. 5C is taken along the section line 5C—5C in FIG. 5B.
Figure 5C:
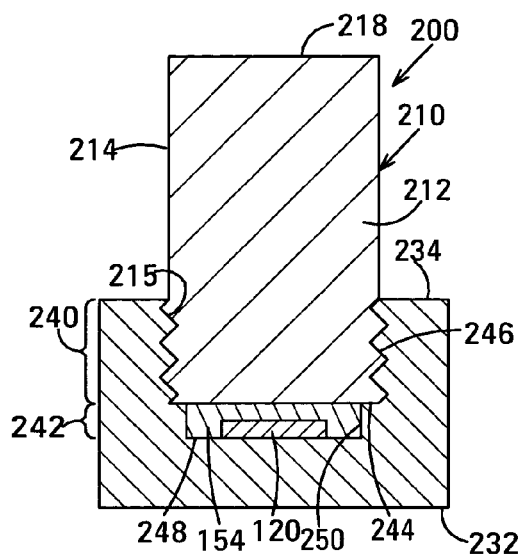
Figure 5B:
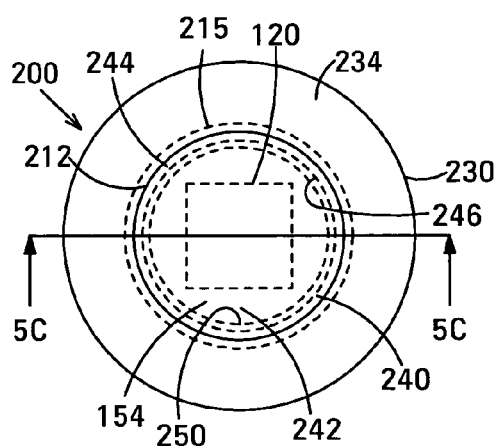

FIGS. 5A–5C are respectively an exploded side view, a top view and a cross-sectional view of another embodiment 200 of an LED in accordance with the invention. LED 200 is composed of a GRIN element 210, semiconductor die 120 and a cup-type header 230.

Header 230 has a device mounting surface 232 and a surface 234 opposite the device mounting surface. LED 200 is mounted on a printed circuit board or other substrate (not shown) with device mounting surface 232 facing the printed circuit board. Device mounting surface 232 carries conductive elements (not shown to simplify the drawing) electrically connected to semiconductor die 120.

Header 230 defines two concatenated cylindrical cavities 240 and 242 that extend, in order, into the header from header surface 234. Cavity 240 is cylindrical in shape. Cavity 240 is a partially closed cavity and has an annular, flat end surface 244 remote from header surface 234 and a threaded, curved side surface 246. Cavity 242 is cylindrical in shape with a smaller diameter than cavity 240, but can have other shapes. Cavity 242 is a closed cavity and has a flat die mounting surface 248 remote from header surface 234. Cavity 242 also has a curved side surface 250.

Cavity 242 accommodates semiconductor die 120 mounted on die mounting surface 248. Cavity 242 additionally accommodates above-described index matching material 154 and an electrical connection, typically a wire bond, that extends between the exposed surface of the die and an electrical conductor that extends through header 230 to mounting surface 232. Neither the electrical connection nor the electrical conductor are shown to simplify the drawing.

GRIN element 210 has a body 212 that exhibits the cylindrical refractive index profile described above. Body 212 is cylindrical in shape. The axes of symmetry of the refractive index profile and the body coincide. Body 212 has a curved side surface 214 and opposed end surfaces 216 and 218. End surface 216 is flat. In the example shown, end surface 218 is also flat. Both end surfaces are orthogonal to the axes of symmetry of body 112 and its cylindrical refractive index profile. In other embodiments, at least end surface 218 is curved, as described above. Body 212 may have shapes other than cylindrical, but exhibits a cylindrical refractive index profile regardless of its shape.

Body 212 includes a cylindrical, threaded portion 215 adjacent and extending orthogonally to end surface 216. The threaded portion is structured to engage with the threaded side surface 246 of cavity 240 in header 230.

The length of body 212 depends on the pitch of the cylindrical refractive index profile of body 212 and the desired radiation pattern. As noted above, LEDs having many different radiation patterns can all be structurally identical apart from the length-to-pitch ratio of the body 212 of their GRIN elements 210.

LED 200 is made in a manner similar to that described above by mounting semiconductor die 120 on the die mounting surface 248 of cavity 242 in header 230, making an electrical connection (not shown) between the header and the light-emitting surface of the die, and introducing a measured quantity of index matching material 154 into cavity 242. Threaded portion 215 of GRIN element 210 is then engaged with the threaded side surface 246 of cavity 240 in header 230 and GRIN element 210 is rotated relative to header 230 until the end surface 216 of the GRIN element abuts the end surface 244 of cavity 240. The juxtaposition of end surface 216 and end surface 244 defines the spatial relationship between the light-emitting surface of semiconductor die 120 and the end surface 216 of GRIN element 210. In one embodiment, an adhesive (not shown) is applied to either or both of threaded portion 215 and threaded side surface 246 prior to engaging the threads. After curing, the adhesive holds GRIN element 210 in place in header 230 and prevents contaminants from leaking past the threads and contaminating semiconductor die 120. LED 200 is then ready for final electrical and electro-optical testing.

GRIN element 210 is manufactured by using a molding process to form a cylindrical core that defines the basic shape of body 212. The molding process additionally defines threaded portion 215 of body 212. A dopant is then deposited on curved side surface 214 by a suitable deposition process such as chemical vapor deposition (CVD). The core is then heated to a temperature at which the dopant diffuses into the core. The diffusion process is continued until the desired cylindrical refractive index profile is obtained. In an another process that can be used to fabricate GRIN element 210, a cylindrical core having a threaded portion is formed as described above, and layers of transparent material having progressively smaller refractive indices are successively deposited on the curved side surface of the core to form an embodiment of GRIN element 210 having a stepped refractive index profile similar to that shown in FIG. 2C. In yet an another process that can be used to fabricate GRIN element 210, a cylindrical core having a threaded portion is formed as described above, and the core is dipped into transparent liquid materials having progressively smaller refractive indices to form thin layers of materials of diminishing refractive index on curved side surface of the core. This process also forms an embodiment of GRIN element 210 having a stepped refractive index profile. Suitable materials are described above. Each layer is allowed to solidify before the next layer is deposited.

In some fabrication embodiments, the length of the core used to fabricate body 212 is that which, together with the pitch obtained by diffusing a dopant into the core or by coating the core, has the length-to-pitch ratio that produces the desired radiation pattern. An inventory of GRIN elements of different lengths is kept to allow LEDs with different radiation patterns to be made. Even with fixed-length GRIN elements, some variation in the radiation pattern can be obtained by varying the refractive index profile of the GRIN element while it is being made.

The number of different length-to-pitch ratios of GRIN element that need to be kept in stock for use in making LEDs in accordance with the invention can be reduced by making the GRIN elements longer than necessary. The GRIN elements are then divided lengthwise after manufacture to obtain the length-to-pitch ratio that produces the desired radiation pattern. GRIN elements of only a single length-to-pitch ratio need be stocked if materials wastage is not an important consideration. Such GRIN elements are those that have a length-to-pitch ratio corresponding to the point source radiation pattern shown in FIG. 3A. GRIN elements that produce other radiation patterns are made simply by dividing the GRIN element lengthwise to produce a GRIN element that has a length that gives the length-to-pitch ratio corresponding to the desired radiation pattern. Less wastage is produced by stocking GRIN elements with a number of different lengths and dividing them lengthwise to obtain the desired length-to-pitch ratio.

Figure 6A:
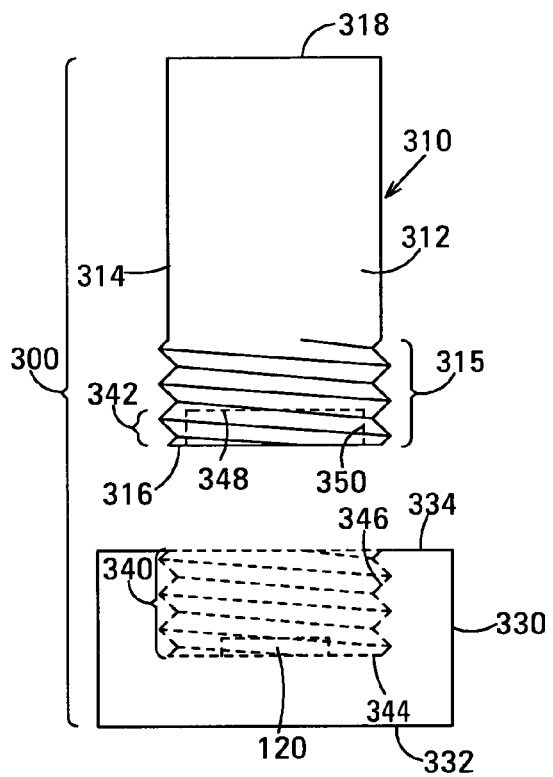
FIGS. 6A–6C are respectively an exploded side view, a top view and a cross-sectional view of another embodiment of an LED in accordance with the invention. The cross-sectional view of FIG. 6C is taken along the section line 6C—6C in FIG. 6B.
Figure 6C:
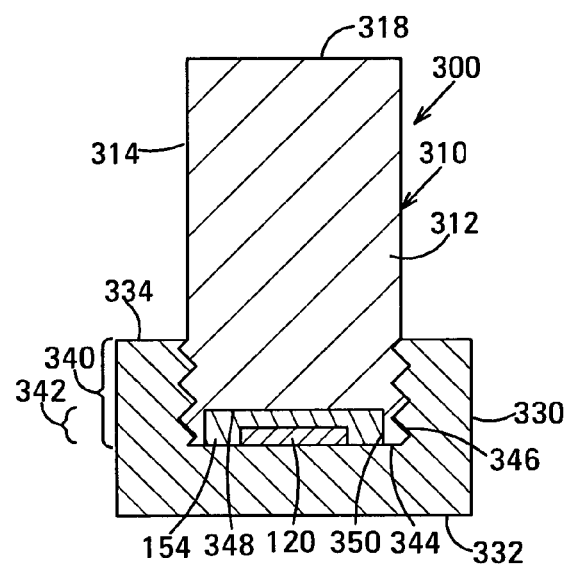
Figure 6B:
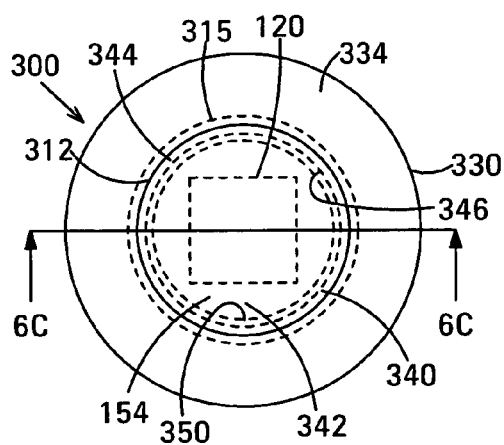
Figure 6D:
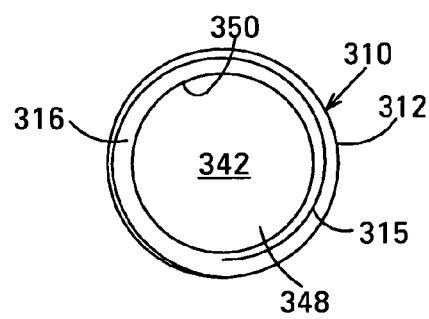
FIG. 6D is an end view of the GRIN element of the LED shown in FIGS. 6A–6C.

FIGS. 6A–6C are respectively an exploded side view, a top view and a cross-sectional view of another embodiment 300 of an LED in accordance with the invention. FIG. 6D is an end view of the GRIN element of the LED. In this embodiment, the header defines one cylindrical cavity and the GRIN element defines another cylindrical cavity.

LED 300 is composed of a GRIN element 310, semiconductor die 120 and a cup-type header 330.

Header 330 has a device mounting surface 332 and a surface 334 opposite the device mounting surface. LED 300 is mounted on a printed circuit board or other substrate (not shown) with device mounting surface 332 facing the printed circuit board. Device mounting surface 332 carries conductive elements (not shown) electrically connected to semiconductor die 120.

Header 330 defines a cylindrical cavity 340 that extends into the header from header surface 334. Cavity 340 is a closed, cylindrical cavity that has a flat die mounting surface 344 remote from header surface 334. Cavity 340 also has a threaded, curved side surface 346. Semiconductor die 120 is mounted on the die mounting surface 344 of cavity 340.

GRIN element 310 has a body 312 that exhibits the cylindrical refractive index profile described above. Body 312 is cylindrical in shape. The axes of symmetry of the refractive index profile and the body coincide. Body 312 has a curved side surface 314 and opposed end surfaces 316 and 318. End surface 316 is annular, flat and orthogonal to the above-mentioned axes of symmetry. In the example shown, end surface 318 is also flat and orthogonal to the above-mentioned axes of symmetry. In other embodiments, at least end surface 318 is curved, as described above. Body 312 may have shapes other than cylindrical, but exhibits a cylindrical refractive index profile regardless of its shape.

Body 312 includes a cylindrical, threaded portion 315 adjacent and extending orthogonally to end surface 316. The threaded portion is structured to engage with the threaded side surface 346 of cavity 340 in header 330.

Additionally defined in the body 312 of GRIN element 310 is a cavity 342 that extends into the body from end surface 316. Cavity 342 is a closed cavity that has an end surface 348 remote from end surface 316. End surface 348 is flat and is orthogonal to the axes of symmetry of body 312 and its cylindrical refractive index profile. In the example shown, cavity 342 is cylindrical and has a curved side surface 350. Other cavity shapes are possible.

When LED 300 is assembled, cavity 342 accommodates semiconductor die 120, an electrical connection, and above-described index matching material 154. The electrical connection is typically a wire bond and extends between the exposed surface of the die and an electrical conductor that extends through header 330 to mounting surface 332. Neither the electrical connection nor the electrical conductor is shown to simplify the drawing.

The length of body 312 depends on the pitch of the cylindrical refractive index profile of body 312 and the desired radiation pattern. As noted above, LEDs having many different radiation patterns can all be structurally identical apart from the length-to-pitch ratio of the body 312 of their GRIN elements 310.

LED 300 is made in a manner similar to that described above by mounting semiconductor die 120 on the die mounting surface 344 of cavity 340 in header 330, making an electrical connection between the header and the light-emitting surface of the die, and introducing a measured quantity of index matching material 154 into cavity 342 in the body 312 of GRIN element 310. Threaded portion 315 of the body 312 of GRIN element 310 is then engaged with the threaded side surface 346 of cavity 340 in header 330 and GRIN element 310 is rotated relative to header 330 until the end surface 316 of the GRIN element abuts the end surface 344 of cavity 340. The juxtaposition of end surface 316 and end surface 344 defines the spatial relationship between the light-emitting surface of semiconductor die 120 and the end surface 348 of cavity 342 in GRIN element 310. In one embodiment, an adhesive (not shown) is applied to either or both of threaded portion 315 and threaded side surface 346 prior to engaging the threads. After curing, the adhesive holds GRIN element 310 in place in header 330 and prevents contaminants from leaking past the threads and contaminating semiconductor die 120. LED 300 is then ready for final electrical and electro-optical testing.

GRIN element 310 is manufactured by processes similar to those described above for forming GRIN element 210 with the exception that the molding process that defines the basic shape of the body 312 additionally defines threaded portion 315 and cavity 342 that extends into body 312 from end surface 316. GRIN elements 310 with different length-to-pitch ratios can be provided in ways similar to those described above with reference to GRIN element 210.

Figure 7A:
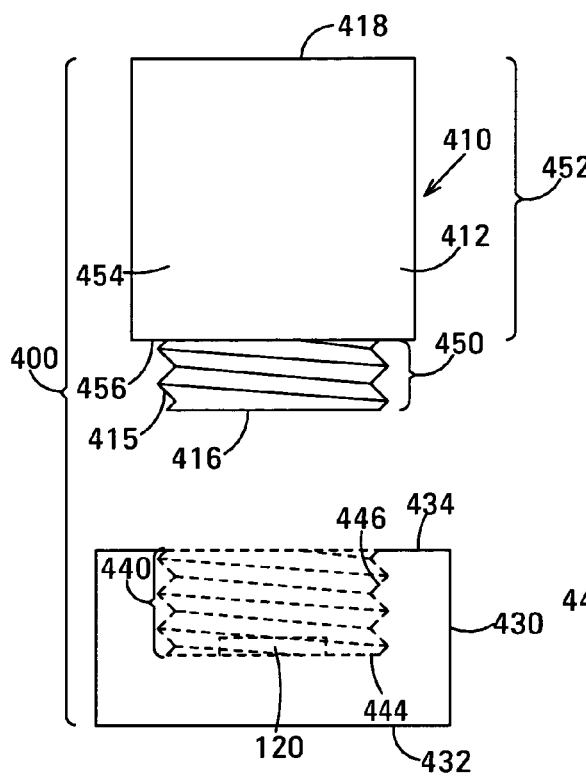
FIGS. 7A–7C are respectively an exploded side view, a top view and a cross-sectional view of another embodiment of an LED in accordance with the invention. The cross-sectional view of FIG. 7C is taken along the section line 7C—7C in FIG. 7B.
Figure 7C:
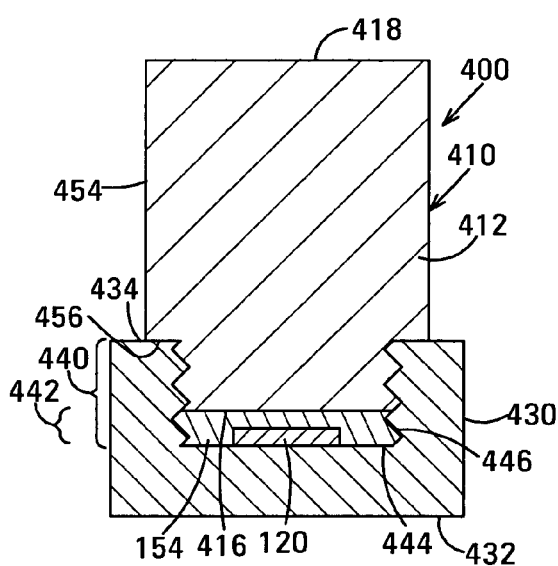
Figure 7B:
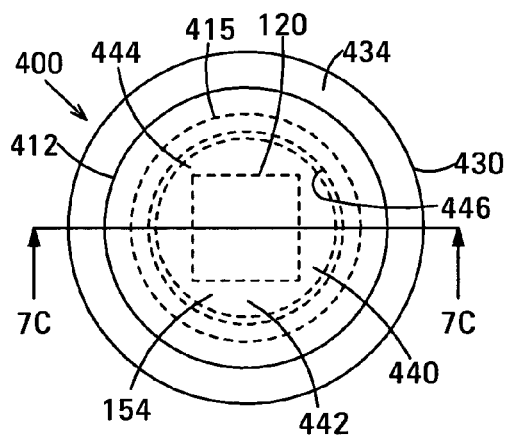

FIGS. 7A–7C are respectively an exploded side view, a top view and a cross-sectional view of another embodiment 400 of an LED in accordance with the invention. In this embodiment, the header defines a cylindrical cavity and the GRIN element has stepped side surface and a threaded portion that is shorter than the depth of the cavity in the header. LED 400 is composed of a GRIN element 410, semiconductor die 120 and a cup-type header 430.

Header 430 has a device mounting surface 432 and a surface 434 opposite the device mounting surface. LED 400 is mounted on a printed circuit board or other substrate (not shown) with device mounting surface 432 facing the printed circuit board. Device mounting surface 432 carries conductive elements (not shown to simplify the drawing) electrically connected to semiconductor die 120.

Header 430 defines a cylindrical cavity 440 that extends into the header from header surface 434. Cavity 440 is a closed, cylindrical cavity that has a flat die mounting surface 444 remote from header surface 434. Cavity 440 also has a threaded, curved side surface 446. Semiconductor die 120 is mounted on the die mounting surface 444 of cavity 440.

GRIN element 410 has a body 412 that exhibits the cylindrical refractive index profile described above. Body 412 is cylindrical in shape. The axes of symmetry of the refractive index profile and the body coincide. Body 412 has a curved side surface 414 and opposed, flat end surfaces 416 and 418. End surfaces 416 and 418 are circular, flat and orthogonal to the above-mentioned axes of symmetry. In other embodiments, at least end surface 418 is curved, as described above.

Body 412 can be regarded as having two cylindrical body portions 450 and 452 concatenated lengthways with body portion 450 adjacent end surface 416 and body portion 452 adjacent end surface 418. Body portion 450 is smaller in diameter than body portion 452. Hence, end surface 416 is smaller in diameter than end surface 418. Body portion 450 has a threaded, curved side surface 415 structured to engage with the threaded side surface 446 of cavity 440 in header 430. Body portion 452 has a curved side surface 454 and an annular end surface 456.

The length of body portion 450 of the body 412 of GRIN element 410 is less than the depth of cavity 440 in header 430. Hence, when LED 400 is assembled, body portion 450 does not occupy all of cavity 440. Header 430 and body portion 450 of GRIN element 410 collectively define a cavity 442, i.e., the portion of cavity 440 not occupied by body portion 450. Cavity 442 accommodates semiconductor die 120, an electrical connection, and above-described index matching material 154. The electrical connection is typically a wire bond and extends between the exposed surface of the die and an electrical conductor that extends through header 430 to device mounting surface 432. Neither the electrical connection nor the electrical conductor is shown to simplify the drawing.

The length of body 412 depends on the pitch of the cylindrical refractive index profile of body 412 and the desired radiation pattern. As noted above, LEDs having many different radiation patterns can all be structurally identical apart from the length-to-pitch ratio of the body 412 of their GRIN elements 410.

LED 400 is made in a manner similar to that described above by mounting semiconductor die 120 on the die mounting surface 444 of cavity 440 of header 430, making an electrical connection between the header and the light-emitting surface of the die, and introducing a measured quantity of index matching material 154 into cavity 440. Threaded side surface 415 of GRIN element 410 is then engaged with the threaded side surface 446 of cavity 440 in header 430 and GRIN element 410 is rotated relative to header 430 until the end surface 456 of body portion 452 abuts the surface 434 of header 430. The juxtaposition of end surface 456 and surface 434 defines cavity 442 and additionally defines the spatial relationship between the light-emitting surface of semiconductor die 120 and the end surface 416 of GRIN element 410. In one embodiment, an adhesive (not shown) is applied to either or both of threaded side surface 415 and threaded surface 446 prior to engaging the threads. After curing, the adhesive holds GRIN element 410 in place in header 430 and prevents contaminants from leaking past the threads and contaminating semiconductor die 120. LED 400 is then ready for final electrical and electro-optical testing.

GRIN element 410 is manufactured by processes similar to those described above for forming GRIN element 210 with the exception that the molding process defines body portions 450 and 452, and additionally defines the threaded side surface 415 of body portion 450. GRIN elements 410 with different length-to-pitch ratios can be provided in ways similar to those described above with reference to GRIN element 210.

Figure 8A:
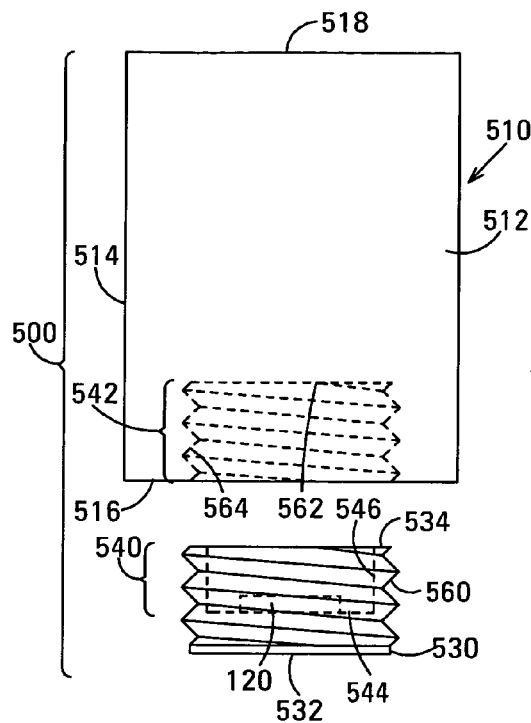
FIGS. 8A–8C are respectively an exploded side view, a top view and a cross-sectional view of another embodiment of an LED in accordance with the invention. The cross-sectional view of FIG. 8C is taken along the section line 8C—8C in FIG. 8B.
Figure 8C:
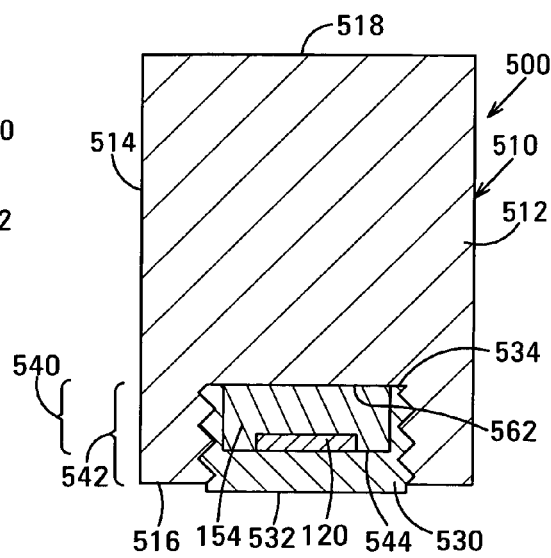
Figure 8B:
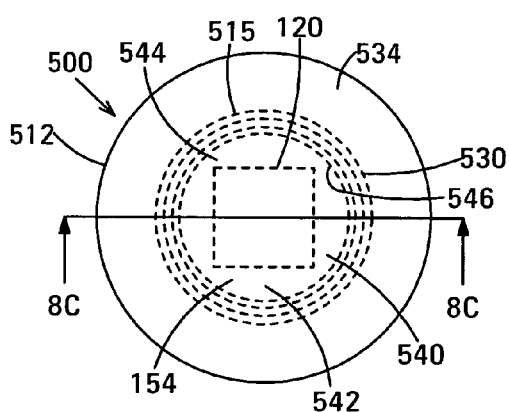

FIGS. 8A–8C are respectively an exploded side view, a top view and a cross-sectional view of another embodiment 500 of an LED in accordance with the invention. In this embodiment, the header has a threaded side surface that engages with the threaded side surface of a cylindrical cavity defined in the GRIN element. LED 500 is composed of a GRIN element 510, semiconductor die 120 and a cup-type header 530.

Header 530 has a device mounting surface 532, a surface 534 opposite the device mounting surface, and a threaded, curved side surface 560. LED 500 is mounted on a printed circuit board or other substrate (not shown) with device mounting surface 532 facing the printed circuit board. Device mounting surface 532 carries conductive elements (not shown to simplify the drawing) electrically connected to die 120.

Header 530 defines a cavity 540 that extends into the header from header surface 534. Cavity 540 is a closed cavity that has a flat die mounting surface 544 remote from header surface 534. Cavity 540 additionally has a side surface 546. In the example shown, cavity 540 is cylindrical in shape and side surface 546 is cylindrical. Cavity 540 may be different in shape from the example shown. Cavity 540 accommodates semiconductor die 120 mounted on die mounting surface 544. Cavity 540 additionally accommodates an electrical connection and above-described index matching material 154. The electrical connection is typically a wire bond and extends between the exposed surface of the die and an electrical conductor that extends through header 530 to device mounting surface 532. Neither the electrical connection nor the electrical conductor is shown to simplify the drawing.

GRIN element 510 has a body 512 that exhibits the cylindrical refractive index profile described above. Body 512 is cylindrical in shape. The axes of symmetry of the refractive index profile and the body coincide. Body 512 has a curved side surface 514 and opposed end surfaces 516 and 518. End surface 516 is annular, flat and orthogonal to the above-mentioned axes of symmetry. In the example shown, end surface 518 is circular, flat and orthogonal to the above-mentioned axes of symmetry. In other embodiments, at least end surface 518 is curved, as described above. Body 512 may have shapes other than cylindrical, but exhibits a cylindrical refractive index profile regardless of its shape.

The body 512 of GRIN element 510 defines a cavity 542 that extends into body 512 from the end surface 516. Cavity 542 is a closed cylindrical cavity and has a flat, circular end surface 562 remote from end surface 516. Cavity 542 additionally has a curved, threaded side surface 564 structured to engage with the threaded curved side surface 560 of header 530.

The length of GRIN element 510 depends on the pitch of the cylindrical refractive index profile of body 512 and the desired radiation pattern. As noted above, LEDs having many different radiation patterns can all be structurally identical apart from the length-to-pitch ratio of the body 512 of their GRIN elements 510. In this embodiment, the length of body 512 is measured between end surfaces 562 and 518.

LED 500 is made in a manner similar to that described above by mounting semiconductor die 120 on the die mounting surface 544 of cavity 540 in header 530, making an electrical connection between the header and the light-emitting surface of the die, and introducing a measured quantity of index matching material 154 into cavity 540 in the body 512 of GRIN element 510. Threaded side surface 560 of header 530 is then engaged with the threaded side surface 564 of cavity 540 in GRIN element 510 and the header is rotated relative to the GRIN element until header surface 534 abuts the end surface 562 of cavity 542. The juxtaposition of header surface 534 and end surface 562 defines the spatial relationship between the light-emitting surface of semiconductor die 120 and the end surface 562 of cavity 542 in GRIN element 510. In one embodiment, an adhesive (not shown) is applied to either or both of the threaded side surface 564 of cavity 542 and the threaded side surface 560 of header 530 prior to engaging the threads. After curing, the adhesive holds header 530 in place in GRIN element 510 and prevents contaminants from leaking past the threads and contaminating semiconductor die 120. LED 500 is then ready for final electrical and electro-optical testing.

GRIN element 510 is manufactured by processes similar to those described above for forming GRIN element 210 with the exception that the molding process that defines the basic shape of the body 512 additionally defines cavity 542 that extends into body 512 from end surface 516 and the threaded side surface 564 of cavity 542. GRIN elements 510 with different length-to-pitch ratios can be provided in ways similar to those described above with reference to GRIN element 210.

Figure 9:
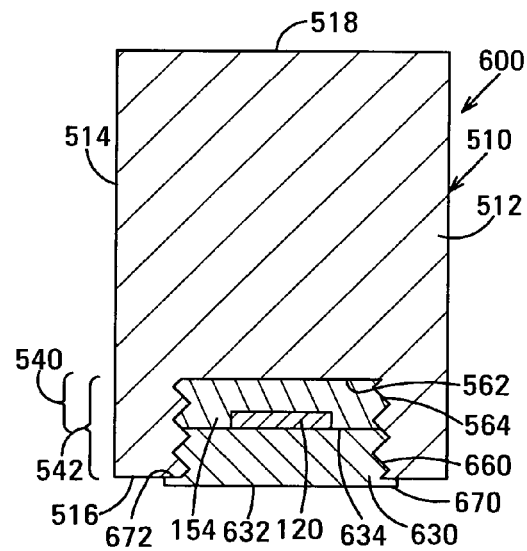
FIG. 9 is a cross-sectional view of another embodiment of an LED in accordance with the invention. The cross section is taken along a section line similar to the section line 8C—8C in FIG. 8B.

FIG. 9 is a cross-sectional view of another embodiment 600 of an LED in accordance with the invention. In this embodiment, the GRIN element defines a single cavity and no cavity is defined in the header. Elements of LED 600 that correspond to elements of LED 500 described above with reference to FIGS. 8A–8C are indicted using the same reference numerals and will not be described in detail again. LED 600 is composed of a GRIN element 510, semiconductor die 120 and a header 630.

Header 630 has a device mounting surface 632, a die mounting surface 634 opposite the device mounting surface, a threaded, curved side surface 660, and a flange 670 that extends out from side surface 660. Flange 660 has an annular flange surface 672 opposite device mounting surface 632. LED 600 is mounted on a printed circuit board or other substrate (not shown) with device mounting surface 632 facing the printed circuit board. Device mounting surface 632 carries conductive elements (not shown) electrically connected to die 120.

Semiconductor die 120 is mounted on the die mounting surface 634 of header 630.

The body 512 of GRIN element 510 defines a cavity 542 with a curved, threaded side surface 564 whose threads are structured to engage with the threaded curved side surface 660 of header 630, as described above. The depth of cavity 542 is greater than the dimension of header 630 from die mounting surface 634 to flange surface 672. As a result, when LED 600 is assembled, header 630 occupies only part of cavity 542 to define a cavity 640, i.e., the portion of cavity 542 not occupied by header 630. Cavity 640 accommodates semiconductor die 120, an electrical connection, and above-described index matching material 154. The electrical connection is typically a wire bond and extends between the exposed surface of the die and an electrical conductor that extends through header 630 to mounting surface 632. Neither the electrical connection nor the electrical conductor is shown to simplify the drawing.

LED 600 is made in a manner similar to that described above by mounting semiconductor die 120 on the die mounting surface 634 of header 630, making an electrical connection between the header and the light-emitting surface of the die and introducing a measured quantity of index matching material 154 into cavity 542 in GRIN element 510. Threaded side surface 660 of header 630 is then engaged with the threaded side surface 564 of cavity 542 in GRIN element 510 and the header is rotated relative to the GRIN element until flange surface 672 abuts the end surface 516 of GRIN element 510. The juxtaposition of flange surface 672 and end surface 516 defines the cavity 540 and additionally defines the spatial relationship between the light-emitting surface of semiconductor die 120 and the end surface 562 of cavity 542 in GRIN element 510. In one embodiment, an adhesive (not shown) is applied to either or both of threaded side surface 564 and threaded side surface 660 prior to engaging the threads. After curing, the adhesive holds header 630 in place in GRIN element 510 and prevents contaminants from leaking past the threads and contaminating semiconductor die 120. LED 600 is then ready for final electrical and electro-optical testing.

This disclosure describes the invention in detail using illustrative embodiments. However, it is to be understood that the invention defined by the appended claims is not limited to the precise embodiments described.

We claim:

1. A light-emitting device, comprising:
   a semiconductor light-emitting die;
   a gradient index (GRIN) element having a cylindrical refractive index profile in which the refractive index varies radially and is substantially constant axially, the GRIN element comprising a first end surface opposite a second end surface and further comprising a cylindrical body having a first diameter, the cylindrical body characterized by a length-to-pitch ratio, the GRIN element arranged with the first end surface adjacent the light-emitting die to receive light therefrom and emitting the light from the second end surface in a radiation pattern dependent on the length-to-pitch ratio;
   a header comprising a cavity extending thereinto, the cavity having a second diameter slightly smaller than the first diameter, the light-emitting die mounted in the cavity defined by the header; and
   a push fit hermetic seal defined by an assembly comprising the GRIN element engaged in the cavity.

2. The light-emitting device of claim 1, in which:
   the length-to-pitch ratio is equal to one fourth; and
   the GRIN element emits the light in a collimated beam.

3. The light-emitting device of claim 1, in which:
   the length-to-pitch ratio is less than one fourth; and
   the GRIN element emits the light in a diverging beam.

4. The light-emitting device of claim 1, in which:
   the length-to-pitch ratio is between one fourth and one half; and
   the GRIN element emits the light in a converging beam.

5. The light-emitting device of claim 1, in which:
   the length-to-pitch ratio is equal to one half; and
   the GRIN element emits the light from a point source.

6. The light-emitting device of claim 1, additionally comprising index matching material located in the cavity.

7. The light-emitting device of claim 1, in which the second diameter is smaller than the first diameter in a range of 30–40 μm.

8. A method of making a light emitting device, the method comprising:
   providing a semiconductor light-emitting die;
   providing a GRIN element having a cylindrical refractive index profile in which the refractive index varies radially and is substantially constant axially, the GRIN element comprising a first end surface opposite a second end surface and further comprising a cylindrical body having a first diameter, the cylindrical body characterized by a length-to-pitch ratio;
   arranging the GRIN element with the first end surface thereof adjacent the light-emitting die to receive light therefrom, the GRIN element emitting the light from the second end surface in a radiation pattern that depends on the length-to-pitch ratio;
   providing a header comprising a cavity extending thereinto, the cavity having a second diameter slightly smaller than the first diameter, the light-emitting die mounted in the cavity defined by the header; and providing a push fit hermetic seal defined by an assembly comprising the GRIN element and the cavity, the push fit hermetic seal being formed by engaging the GRIN element with the cavity.

9. The method of claim 8, in which:

providing a GRIN element comprises:

providing GRIN elements each having a cylindrical refractive index profile, comprising a first end surface opposite a second end surface, and characterized by respective length-to-pitch ratio, the length-to-pitch ratios differing among the GRIN elements, and selecting one of the GRIN elements as a selected GRIN element, the selected GRIN element having a length-to-pitch ratio corresponding to a desired radiation pattern; and in the arranging, the selected GRIN element is arranged with the first end surface thereof adjacent the light source.

10. The method of claim 8, in which providing a GRIN element comprises:

providing an elongate rod having a cylindrical refractive index profile characterized by a pitch; and dividing off from the rod a lengthwise portion to provide the GRIN element.

11. The method of claim 8, additionally comprising dividing the rod lengthwise into portions, ones of the portions having different lengths to provide the GRIN elements of light-emitting devices having different radiation patterns.

12. The method of claim 8, additionally comprising:

providing an additional GRIN element having a cylindrical refractive index profile, comprising a first end surface opposite a second end surface and characterized by a length-to-pitch ratio different from the length-to-pitch ratio of the GRIN element; and substituting the additional GRIN element for the GRIN element to change the radiation pattern of the light-emitting device.

* * * * *

UNITED STATES PATENT AND TRADEMARK OFFICE
CERTIFICATE OF CORRECTION

| | |
|---|---|
| PATENT NO. | : 7,102,177 B2 |
| APPLICATION NO. | : 10/649094 |
| DATED | : September 5, 2006 |
| INVENTOR(S) | : Kee Siang Goh et al. |

It is certified that error appears in the above-identified patent and that said Letters Patent is hereby corrected as shown below:

Column 18, Line 6, Claim 11, delete "claim 8," and insert -- claim 10, --.

Signed and Sealed this
Twenty-eighth Day of December, 2010

David J. Kappos
*Director of the United States Patent and Trademark Office*